(12) United States Patent
Allen et al.

(10) Patent No.: US 10,861,690 B2
(45) Date of Patent: Dec. 8, 2020

(54) LED APPARATUS EMPLOYING NEODYMIUM-FLUORINE MATERIALS

(71) Applicant: GE LIGHTING SOLUTIONS, LLC, East Cleveland, OH (US)

(72) Inventors: Gary Robert Allen, Chesterland, OH (US); Dengke Cai, Willoughby, OH (US); Thomas Clynne, Lakewood, OH (US); Jianmin He, Orange, OH (US); Cherian Jacob, Brecksville, OH (US); James Reginelli, Parma, OH (US); Joshua Ian Rintamaki, Westlake, OH (US); Zhiyong Wang, ShangHai (CN)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 0 days.

(21) Appl. No.: 14/876,366

(22) Filed: Oct. 6, 2015

(65) Prior Publication Data
US 2016/0097496 A1    Apr. 7, 2016

Related U.S. Application Data

(60) Provisional application No. 62/061,129, filed on Oct. 7, 2014.

(30) Foreign Application Priority Data

Oct. 8, 2014  (WO) ................ PCT/CN2014/088116

(51) Int. Cl.
*F21K 99/00*    (2016.01)
*H01L 25/16*    (2006.01)
(Continued)

(52) U.S. Cl.
CPC ................ *H01J 61/40* (2013.01); *F21K 9/23* (2016.08); *F21K 9/64* (2016.08); *F21K 9/66* (2016.08);
(Continued)

(58) Field of Classification Search
None
See application file for complete search history.

(56) References Cited

U.S. PATENT DOCUMENTS

| 2,188,298 A | 1/1940 | Hitchcock |
| 3,505,239 A | 4/1970 | Mazelsky et al. |

(Continued)

FOREIGN PATENT DOCUMENTS

| CN | 1503382 A | 6/2004 |
| CN | 1555308 A | 12/2004 |

(Continued)

OTHER PUBLICATIONS

Stefanidaki, Evanthia, et al. "Oxide solubility and raman spectra of NdF 3-LiF—KF—MgF 2-Nd 2 O 3 melts." Journal of the Chemical Society, Dalton Transactions 11 (2002): 2302-2307.*
(Continued)

*Primary Examiner* — Nicholas J Tobergte
*Assistant Examiner* — Kien C Ly
(74) *Attorney, Agent, or Firm* — Wood IP LLC (57) ABSTRACT

The specification and drawings present a new apparatus such as a lighting apparatus, the apparatus comprising at least one LED (or OLED) module, configured to generate a visible light such as white light, and at least one component such as optical component comprising a compound consisting essentially of the elements neodymium (Nd) and fluorine (F), and optionally including one or more other elements. The lighting apparatus is configured to provide a desired light spectrum by filtering the generated visible light using the compound.

20 Claims, 9 Drawing Sheets

(51) Int. Cl.

| | | |
|---|---|---|
| H01L 33/56 | (2010.01) | |
| H01L 33/50 | (2010.01) | |
| H01L 51/52 | (2006.01) | |
| H01J 61/40 | (2006.01) | |
| G02B 1/04 | (2006.01) | |
| F21K 9/64 | (2016.01) | |
| F21V 3/12 | (2018.01) | |
| H01L 33/44 | (2010.01) | |
| H01J 9/20 | (2006.01) | |
| H01K 1/32 | (2006.01) | |
| F21K 9/23 | (2016.01) | |
| F21V 7/28 | (2018.01) | |
| F21K 9/66 | (2016.01) | |
| F21V 3/06 | (2018.01) | |
| F21V 9/08 | (2018.01) | |
| G02B 5/22 | (2006.01) | |
| F21Y 115/10 | (2016.01) | |
| F21K 9/232 | (2016.01) | |
| F21Y 113/13 | (2016.01) | |
| F21K 9/233 | (2016.01) | |
| F21K 9/60 | (2016.01) | |
| F21S 8/04 | (2006.01) | |
| H01J 61/02 | (2006.01) | |

(52) U.S. Cl.
CPC ............. *F21V 3/0625* (2018.02); *F21V 3/12* (2018.02); *F21V 7/28* (2018.02); *F21V 9/08* (2013.01); *G02B 1/04* (2013.01); *G02B 5/223* (2013.01); *H01J 9/20* (2013.01); *H01K 1/32* (2013.01); *H01L 33/44* (2013.01); *H01L 51/5262* (2013.01); *F21K 9/232* (2016.08); *F21K 9/233* (2016.08); *F21K 9/60* (2016.08); *F21S 8/04* (2013.01); *F21Y 2113/13* (2016.08); *F21Y 2115/10* (2016.08); *H01J 61/025* (2013.01); *H01L 33/502* (2013.01); *H01L 33/507* (2013.01); *H01L 33/56* (2013.01); *H01L 2224/48091* (2013.01); *H01L 2224/73265* (2013.01); *H01L 2224/8592* (2013.01); *H01L 2251/5361* (2013.01)

(56) References Cited

U.S. PATENT DOCUMENTS

| | | | |
|---|---|---|---|
| 4,005,324 A | 1/1977 | Dolenga et al. | |
| 4,395,653 A | 7/1983 | Graff | |
| 4,441,046 A | 4/1984 | James | |
| 4,633,127 A | 12/1986 | Beurskens | |
| 4,636,072 A | 1/1987 | Yahraus | |
| 5,083,252 A | 1/1992 | McGuire | |
| 5,252,887 A | 10/1993 | Reisman | |
| 6,749,777 B2 | 6/2004 | Argoitia et al. | |
| 6,940,101 B2 | 9/2005 | Yano et al. | |
| 7,226,966 B2 | 6/2007 | Kambe et al. | |
| 7,583,443 B2 | 9/2009 | Zaczek | |
| 7,695,641 B2 | 4/2010 | Mataki et al. | |
| 8,343,392 B2 | 1/2013 | Zhang | |
| 8,349,225 B2 | 1/2013 | Yue | |
| 8,389,958 B2 | 3/2013 | Vo-Dinh et al. | |
| 8,415,410 B2 | 4/2013 | Nitta | |
| 8,459,814 B2 | 6/2013 | Su et al. | |
| 9,312,249 B2* | 4/2016 | Choi | H01L 25/13 |
| 2004/0125459 A1 | 7/2004 | Tanitsu et al. | |
| 2004/0196538 A1* | 10/2004 | Burgener, II | H01S 3/102 |
| | | | 359/341.5 |
| 2004/0219116 A1 | 11/2004 | Reynders et al. | |
| 2006/0176244 A1* | 8/2006 | Hori | H01L 27/322 |
| | | | 345/45 |
| 2006/0255716 A1* | 11/2006 | Tsutsumi | B82Y 30/00 |
| | | | 313/502 |
| 2007/0241657 A1* | 10/2007 | Radkov | C09K 11/0883 |
| | | | 313/483 |
| 2009/0180788 A1 | 7/2009 | Tamoto et al. | |
| 2009/0302236 A1* | 12/2009 | Vogt | C09K 11/7705 |
| | | | 250/461.1 |
| 2010/0149510 A1 | 6/2010 | Zaczek et al. | |
| 2010/0277887 A1 | 11/2010 | Su et al. | |
| 2010/0320480 A1 | 12/2010 | Rapoport et al. | |
| 2011/0155972 A1* | 6/2011 | Wu | C09K 11/7792 |
| | | | 252/586 |
| 2011/0250406 A1 | 10/2011 | Zia | |
| 2011/0279998 A1* | 11/2011 | Su | H01L 33/46 |
| | | | 362/84 |
| 2012/0057100 A1 | 3/2012 | Masuda et al. | |
| 2012/0155061 A1 | 6/2012 | Manabe et al. | |
| 2012/0230032 A1 | 9/2012 | Sumiya et al. | |
| 2013/0328100 A1* | 12/2013 | Kono | H01L 33/52 |
| | | | 257/100 |
| 2014/0049965 A1* | 2/2014 | Aanegola | H01L 33/44 |
| | | | 362/259 |
| 2014/0191653 A1 | 7/2014 | Mark et al. | |
| 2014/0226335 A1 | 8/2014 | Menkara | |
| 2014/0257439 A1 | 9/2014 | Douglas | |
| 2014/0268794 A1* | 9/2014 | Donofrio | F21V 9/08 |
| | | | 362/293 |
| 2014/0268819 A1 | 9/2014 | Negley et al. | |
| 2015/0070875 A1 | 3/2015 | Hirosaki et al. | |
| 2015/0109758 A1 | 4/2015 | Allen et al. | |
| 2015/0188006 A1 | 7/2015 | Williams et al. | |
| 2015/0252953 A1 | 9/2015 | Progl et al. | |
| 2015/0279651 A1 | 10/2015 | Reisman et al. | |
| 2015/0377429 A1* | 12/2015 | Yoo | C09K 11/7792 |
| | | | 313/503 |
| 2016/0097496 A1 | 4/2016 | Allen et al. | |
| 2016/0097497 A1 | 4/2016 | Benner et al. | |
| 2016/0099141 A1 | 4/2016 | Reisman et al. | |
| 2016/0238230 A1* | 8/2016 | Trottier | F21V 19/004 |
| 2016/0290573 A1 | 10/2016 | Allen et al. | |
| 2016/0303394 A1* | 10/2016 | Hayashi | A61N 5/0614 |
| 2017/0261181 A1 | 9/2017 | Cai et al. | |

FOREIGN PATENT DOCUMENTS

| | | |
|---|---|---|
| CN | 101522730 A | 9/2009 |
| CN | 102201549 A | 9/2011 |
| CN | 102401919 A | 4/2012 |
| CN | 102473821 | 5/2012 |
| CN | 103026515 | 4/2013 |
| CN | 103043699 A | 4/2013 |
| CN | 104378970 | 2/2015 |
| CN | 105720163 A | 6/2016 |
| DE | 69917065 T2 | 4/2005 |
| EP | 1135973 A1 | 9/2001 |
| EP | 2135916 A2 | 12/2009 |
| EP | 2485071 | 8/2012 |
| FR | 2978448 A1 | 2/2013 |
| JP | 5156851 A | 5/1976 |
| JP | 5158444 A | 5/1976 |
| JP | 58225148 A | 12/1983 |
| JP | H04-050136 A | 2/1992 |
| JP | 0419480 A | 7/1992 |
| JP | 04194803 A | 7/1992 |
| JP | 2000-11954 | 1/2000 |
| JP | 2000011954 A | 1/2000 |
| JP | 5156581 B2 | 3/2013 |
| JP | 5158444 B2 | 3/2013 |
| WO | 2008111878 A2 | 9/2008 |
| WO | 2011/142127 A1 | 11/2011 |
| WO | 2012119158 A1 | 9/2012 |
| WO | 2013/118206 A1 | 8/2013 |
| WO | 2013180216 A1 | 12/2013 |
| WO | 2014/063011 A1 | 4/2014 |
| WO | 2015035425 | 3/2015 |
| WO | 2015035425 A1 | 3/2015 |
| WO | 2013118206 A1 | 5/2015 |
| WO | 2016/054764 A1 | 4/2016 |
| WO | 2016/057604 A1 | 4/2016 |
| WO | 2016089810 | 6/2016 |

(56) References Cited

FOREIGN PATENT DOCUMENTS

| WO | 2016089810 | A1 | 6/2016 | |
|---|---|---|---|---|
| WO | 2016195938 | | 12/2016 | |
| WO | 2016195938 | A1 | 12/2016 | |
| WO | WO-2018157288 | A1 * | 9/2018 | ............... F21V 9/08 |

OTHER PUBLICATIONS

Li et al., "Controllable Energy Transfer in Fluorescence Upconversion of NdF3 and NaNdF4 Nanocrystals", Optics Express, vol. No. 18, Issue No. 4, pp. 3364-3369, 2010.

PCT Search Report and Written Opinion issued in connection with related PCT Application No. PCT/CN2014/088116 dated Apr. 28, 2015.

PCT Search Report and Written Opinion issued in connection with corresponding PCT Application No. PCT/US2015/054373 dated Dec. 21, 2015.

U.S. Non-Final Office Action issued in connection with related U.S. Appl. No. 14/966,329 dated Apr. 29, 2016.

Reben, Manuela, et al. "Nd3+-doped oxyfluoride glass ceramics optical fibre with SrF2 Nanocrystals." Optica Applicata 42.2, 2012.

U.S. Non-Final Office Action issued in connection with corresponding U.S. Appl. No. 14/931,476 dated Jul. 18, 2016.

PCT Search Report and Written Opinion issued in connection with related PCT Application No. PCT/US2016/059974 dated Feb. 15, 2017.

PCT Search Report and Written Opinion issued in connection with related PCT Application No. PCT/US2016/065149 dated Feb. 27, 2017.

U.S. Final Office Action issued in connection with related U.S. Appl. No. 14/931,476 dated May 5, 2017.

Beaury, et al., Neutron Powder Diffraction Studies of Stoichiometric NdOF between 1.5 and 300K, GE co-pending Application No. PCT/US2016/059974, 5 pages.

International Search Report and written opinion issued in connection with corresponding PCT Application No. PCT/US2016/059974 dated Feb. 15, 2017.

PCT Application No. PCT/CN2017/075209 dated Feb. 28, 2017.

Notification of Reasons for Refusal issued in connection with corresponding JP Application No. 2017-518287 dated Oct. 9, 2018.

First Office Action and Search issued in connection with corresponding CN Application No. 201480082766.7 dated Dec. 4, 2018 (English Translation Unavailable).

Extended European Search Report and Opinion issued in connection with corresponding EP Application No. 14903619.6 dated May 17, 2018.

IPRP issued in connection with corresponding PCT Application No. PCT/US2016/065149 dated Jun. 12, 2018.

PCT IPRP and written opinion issued in connection with corresponding PCT Application No. PCT/US2016/059974 dated May 8, 2018.

Yi, Q., et al., Low refractive index neodymium fluoride doped polycarbonate, GE co-pending Application No. PCT/CN2017/075209, filed on Feb. 28, 2017.

U.S. Appl. No. 14/966,329, filed Dec. 11, 2015, Kevin Jeffrey Benner et al.

U.S. Appl. No. 15/515,755, filed Mar. 30, 2017, Dengke Cai et al.

U.S. Appl. No. 14/931,476, filed Nov. 3, 2015, Juliana P. Reisman et al.

* cited by examiner

LED APPARATUS EMPLOYING NEODYMIUM-FLUORINE MATERIALS

CROSS-REFERENCE TO RELATED APPLICATIONS

This non-provisional U.S. patent application claims the benefit of the filing date under 35 USC 119(e) of U.S. provisional patent application No. 62/061,129 filed on Oct. 7, 2014, the teachings of which are incorporated herein by reference in their entirety. This non-provisional U.S. patent application claims the benefit of the filing date under 35 USC 119(a-d) of International PCT patent application No. PCT/CN2014/088116 filed on Oct. 8, 2014, the teachings of which are incorporated herein by reference in their entirety.

TECHNICAL FIELD

The invention generally relates to lighting applications and related technologies and more particularly but not exclusively, this invention relates to using compounds comprising neodymium and fluorine for imparting a desired color filtering effect in an LED light apparatus.

BACKGROUND

Light emitting diodes (LEDs), which, as used herein also encompasses organic LEDs (OLEDs), are solid-state semiconductor devices that convert electrical energy into electromagnetic radiation that includes visible light (wavelengths of about 400 to 750 nm). An LED typically comprises a chip (die) of a semiconducting material, doped with impurities to create a p-n junction. The LED chip is electrically connected to an anode and a cathode, all of which are often mounted within an LED package. In comparison to other lamps such as incandescent or fluorescent lamps, LEDs emit visible light is more directional in a narrower beam.

An OLED typically comprises at least one emissive electroluminescent layer (a film of organic semiconductor) situated between electrodes (at least one electrode being transparent). The electroluminescent layer emits light in response to an electric current flowing between electrodes.

LED/OLED light sources (lamps) provide a variety of advantages over traditional incandescent and fluorescent lamps, including but not limited to a longer life expectancy, higher energy efficiency, and full brightness without requiring time to warm up.

Despite the appeal of LED/OLED lighting in terms of efficiency, longevity, flexibility, and other favorable aspects, there remains a need for continuous improvement in the color properties of LED lighting, especially in white LED/OLED devices, for use in both general illumination and in display applications.

Figure 1:
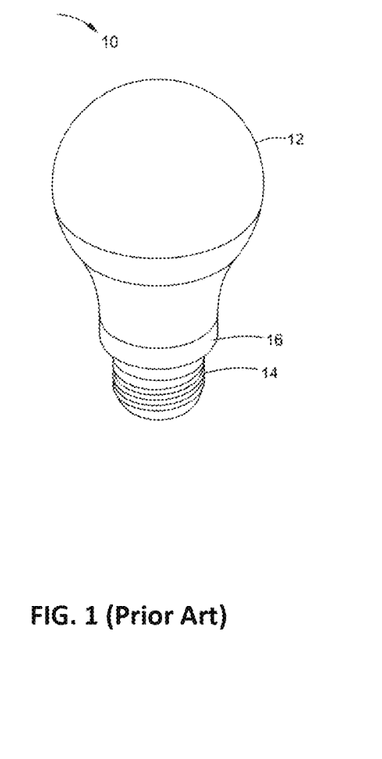
FIG. 1 is a perspective view of a conventional LED-based lighting apparatus.

FIG. 1 is a perspective view of a conventional LED-based lighting apparatus 10 suitable for area lighting applications. The lighting apparatus (which may also be referred to as a "lighting unit" or "lamp") 10 includes a transparent or translucent cover or enclosure 12, a threaded base connector 14, and a housing or base 16 between the enclosure 12 and the connector 14.

An LED-based light source (not shown) which can be an LED array including multiple LED devices, which may be located at the lower end of the enclosure 12 and adjacent the base 16. Because LED devices emit visible light in narrow bands of wavelengths, for example, green, blue, red, etc., combinations of different LED devices are often employed in LED lamps to produce various light colors, including white light. Alternatively, light that appears substantially white may be generated by a combination of light from a blue LED and a phosphor (e.g., yttrium aluminum garnet: cerium, abbreviated as YAG:Ce) that converts at least some of the blue light of the blue LED to a different color; the combination of the converted light and the blue light can generate light that appears white or substantially white. The LED devices can be mounted on a carrier within the base 16, and can be encapsulated on the carrier with a protective cover comprising an index-matching material to enhance the efficiency of visible light extraction from the LED devices.

To promote the capability of the lighting apparatus 10 to emit visible light in a nearly omnidirectional manner, the enclosure 12 shown in FIG. 1 may be substantially spheroidal or ellipsoidal in shape. To further promote a nearly omnidirectional lighting capability, the enclosure 12 may include a material that enables the enclosure 12 to function as an optical diffuser. Materials employed to produce the diffuser may include polyamides (e.g., nylon), polycarbonate (PC), polypropylene (PP), or the like. These polymeric materials can also include $SiO_2$ to promote refraction of the light and thereby to achieve a white reflective appearance. The inner surface of the enclosure 12 may be provided with a coating (not shown) that contains a phosphor composition.

Though the use of combinations of different LED devices and/or phosphors can be utilized to promote the ability of LED lamps to produce a white light effect, other approaches are desirable as alternatives, or in addition thereto, to improve chromatic characteristics of the white light generated by the LED devices.

SUMMARY OF THE INVENTION

According to an aspect of the invention, an apparatus comprising: at least one light emitting diode (LED) module, configured to generate a visible light; and at least one component comprising a compound comprising elements of neodymium (Nd) and fluorine (F) and configured to provide a desired light spectrum by filtering the generated visible light using the compound.

Still further to the aspect of the invention, the compound may comprise $Nd^{3+}$ ions and $F^-$ ions.

According still further to the aspect of the invention, the at least one LED module may comprise an organic LED.

According yet further still to an aspect of the invention, the at least one component may be an encapsulating layer deposited on a top of the at least one LED module. Further, the encapsulating layer may comprise a glass (e.g., a low temperature glass), a polymer, a polymer precursor, a thermoplastic or thermoset polymer or resin, an epoxy, a silicone, or a silicone epoxy resin. Still further, the at least one component may further comprise a phosphor.

Yet still further according to the aspect of the invention, the at least one component may be an encapsulating layer deposited on a further encapsulating layer comprising a phosphor, the further encapsulating layer being deposited on a top of at least one LED.

According yet further still to the aspect of the invention, the compound may comprise one or more of Nd—F and Nd—X—F compounds, wherein X is one or more of elements O, N, S, Cl, OH, Na, K. Al, Mg, Li, Ca, Sr, Ba and Y. Further, the compound may be at least one of $NdF_3$ and NdFO.

According further still to the aspect of the invention, the at least one component may be an optical component comprising a transparent, translucent or reflective substrate with a coating on a surface of the substrate, the coating comprising the compound with Nd and F to provide the desired light spectrum by filtering the generated visible light. Further, a weight percentage of the compound in the coating may be from about 1% to about 20%, and a thickness of the coating may be in a range from about 50 nm to about 1000 microns. Still further, the coating may further comprise an additive having a higher refractive index than the compound, and wherein the additive is selected from metal oxides and non-metal oxides (wherein the additive may be selected from the group consisting of $TiO_2$, $SiO_2$ and $Al_2O_3$). Yet further, the coating may be coated on an inner surface of the substrate. Yet still further, the substrate may be a diffuser being selected from the group consisting of a bulb, a lens, and a dome enclosing the at least one LED module. Further still, the optical component may further comprise a bonding layer between the substrate and the coating, the bonding layer comprises an organic adhesive or an inorganic adhesive.

According still further to the aspect of the invention, the coating may be coated on the surface of the substrate by one of a spray coating method and an electrostatic coating method.

According yet further still to aspect of the invention, the compound may comprise discrete particles of an organic or inorganic material, a particle size of the organic or inorganic material being in a range from about 1 nm to about 10 microns.

Yet still further according to the aspect of the invention, the apparatus may comprise a circuit (e.g., an integrated circuit) and a plurality of LED modules with at least one of said components (e.g., a corresponding plurality of components).

BRIEF DESCRIPTION OF THE DRAWINGS

These and other features and aspects of the present disclosure will become better understood when the following detailed description is read with reference to the accompanying drawings, in which like characters represent like parts throughout the drawings, wherein.

DETAILED DESCRIPTION

A new apparatus such as a lighting apparatus is presented herein, the apparatus comprising at least one LED (or OLED) module configured to generate a visible light such as white light, and at least one component such as an optical component comprising a compound comprising elements of neodymium (Nd) and fluorine (F), and optionally comprising one or more other elements. The lighting apparatus is configured to provide a desired light spectrum by filtering the generated visible light using the compound, as described herein. Typically the compound comprises $Nd^{3+}$ ions and $F^-$ ions. For the purpose of this invention, a "Nd—F compound" should be broadly construed to include compounds comprising neodymium and fluoride and optionally other elements.

According to one embodiment, the component may include a composite/encapsulating layer on a surface of the LED (OLED) chip so that a Nd—F compound such as $NdF_3$, and/or others disclosed herein, can be blended (dispersed) in that encapsulating layer, e.g., along with a phosphor, to achieve favorable visible absorption profiles. The composite/encapsulating layer may be formed using a low temperature glass, a polymer, a polymer precursor, a silicone or silicone epoxy resin or precursor, and the like.

According to another embodiment, the optical component may be a transparent, translucent, reflective or transflective (partially reflective and transmitting) substrate, and a coating on a surface of the substrate can apply a color filtering effect to the visible light, generated by the LED module, while it is passing through the optical component, e.g., to filter the visible light in the yellow light wavelength range, for example, for wavelengths from about 560 nm to about 600 nm.

Furthermore, the transparent or translucent substrate of the optical component may be a diffuser, such as a bulb, a lens and an envelope enclosing at least one LED chip. Moreover, the substrate may be a reflective substrate, and the LED chip can be arranged outside of the substrate. The Nd—F and/or Nd—X—F compound coating may be disposed on a surface of the substrate, and the thickness of the coating should be sufficient to achieve the color filtering effect. The thickness may typically be within a range from 50 nm to 1000 microns, with a preferred thickness being between 100 nm to 500 microns.

The resultant devices can exhibit improvement of light parameters using filtering with Nd—F compounds/materials having intrinsic absorption in the visible region between about 530 nm and 600 nm to enhance at least one of: CSI (color saturation index); CRI (color rendering index); R9 (color rendering value for a particular color chip); "revealness" (which is a color rendering metric understood by the artisan as referring to lighting preference index, LPI); or the like. R9 is defined as one of 6 saturated test colors not used in calculating CRI. The "revealness" is a parameter of the emitted light based on a version of the LPI, which is described in co-pending, commonly owned International application PCT/US2014/054868, filed Sep. 9, 2014 (published as WO2015/035425 on Mar. 12, 2015), and hereby incorporated by reference in pertinent part.

In one embodiment, it is advantageous to utilize relatively low refractive index (RI) Nd—F materials (such as $NdF_3$ having RI around 1.6) to match the RI of the encapsulation materials, in order to achieve a lower scattering loss in LED packages and chip-on-board (COB) arrays. Moreover, it is further advantageous to be able to tune the absorption spectrum by including an electronegative "X" atom in a Nd—X—F material, where X can be, for example, O, N, S, Cl, or the like, to broaden the absorption at around 580 nm and thus possibly to enhance color rendering of an R9 color chip. Any of the foregoing may be blended into an encapsulating material for color adjustment purposes. Upon selection of an appropriate Nd—F or Nd—X—F material (to be more fully defined below), the scattering losses due to RI mismatch can be minimized. The use of Nd—F compounds may also be advantageous for use in LED lighting applications containing short UV wavelengths, since Nd—F compounds are generally not activated in a wavelength range about 380-450 nm.

According to another embodiment, the Nd—F compound may comprise neodymium fluoride ($NdF_3$), or neodymium oxyfluoride (e.g., $NdO_xF_y$ where $2x+y=3$, such as $Nd_4O_3F_6$.), or neodymium fluoride comprising adventitious water and/or oxygen, or a neodymium hydroxide fluoride (e.g., $Nd(OH)_aF_b$ where $a+b=3$), or numerous other compounds comprising neodymium and fluoride which will become readily apparent from the following description. In some applications, the Nd—F compound may have a relatively low refractive index, such as a refractive index that matches selected polymeric materials to provide a low-loss blend. One such Nd—F material is believed to be neodymium fluoride ($NdF_3$), which has a refractive index of around 1.6, providing a suitably low refractive index for index matching with certain polymeric matrix materials to minimize scattering losses.

According to a further embodiment, other Nd—F compounds/materials can be used to advantage as described herein. For instance, other compounds containing Nd—F, non-limiting examples of which may include Nd—X—F compounds. In addition to the previous statement that X can be O, N, S, Cl, or the like, X can also be at least one metallic element (other than Nd) that can form a compound with fluorine. Examples are: a metallic element such as Na, K, Al, Mg, Li, Ca, Sr, Ba, or Y, or combinations of such elements. For example, a Nd—X—F compound may comprise $NaNdF_4$. Further examples of Nd—X—F compounds may include compounds in which X may be Mg and Ca or may be Mg, Ca and O; as well as other compounds containing Nd—F, including perovskite structures doped with neodymium. Certain Nd—X—F compounds may advantageously enable broader absorption at wavelengths of about 580 nm. Since a neodymium oxyfluoride compound may comprise varying amounts of O and F (since neodymium oxyfluoride compounds are typically derived from varying amounts of neodymia $Nd_2O_3$ and neodymium fluoride $NdF_3$), a neodymium oxyfluoride compound may have a selected refractive index that is between that of a Nd—O compound (for example, 1.8 for neodymia) and a Nd—F compound (for example, 1.60 for $NdF_3$). Non-limiting examples of perovskite structure materials doped with neodymium can include those containing at least one constituent having a lower refractive index than the neodymium compound (e.g., $NdF_3$), for example, metal fluorides of Na, K, Al, Mg, Li, Ca, Sr, Ba, and Y. Such "host" compounds may have lower refractive indices than $NdF_3$ in the visible light spectrum, non-limiting examples of which may include NaF (n=1.32), KF (n=1.36), $AlF_3$ (n=1.36), $MgF_2$ (n=1.38), LiF (n=1.39), $CaF_2$ (n=1.44), $SrF_2$ (n=1.44), $BaF_2$ (n=1.48), and $YF_3$ (n=1.50) at a wavelength of 589 nm. As a result of doping with a high refractive index Nd—F compound, for example, $NdF_3$, the resulting doped perovskite structure compound can have a refractive index that is between that of the host (for example, 1.38 for $MgF_2$) and that of $NdF_3$ (1.60). The refractive index of the $NdF_3$-doped metal fluoride compound will depend on the ratio of Nd and metal ions.

The refractive index of $NdF_3$ is about 1.60. Therefore, it may sometimes be considered as providing a relative good RI match blend with silicone (which may have a refractive index around 1.51). An even better match may be obtained by mixing $NdF_3$ with another material that may or may not comprise Nd. For example, $NaNdF_4$ has an RI around 1.46. Thus, by proper blending of $NdF_3$ with another material such as NaF or $NaNdF_4$, the refractive index of the blend can be made to match that of silicone even better.

Figure 2:
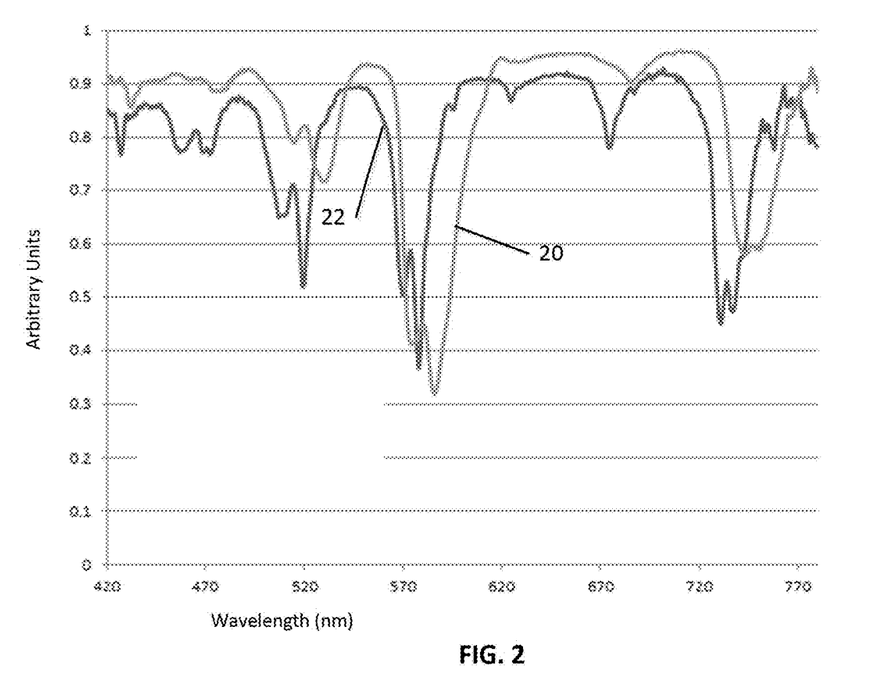
FIG. 2 is a graph comparing absorption in a visible spectrum of neodymium fluoride dispersed in silicone vs. that of standard neodymium glass.

FIG. 2 is a graph comparing absorption in a visible spectrum of neodymium fluoride dispersed in silicone represented by a curve 22, vs. that of standard neodymium glass (e.g., using $Na_2O$—$Nd_2O_3$—CaO—MgO—$Al2O_3$—$K_2O$—$B_2O_3$—$SiO_2$ as a composition for the Nd glass) represented by a curve 20 as a function of wavelength. It is significant that the respective materials share many of the same absorptive features, especially in the yellow (e.g., about 570 nm-about 590 nm) region. In use, one may encapsulate an LED chip/die with an encapsulant (e.g., silicone, epoxy, acrylic, or the like); the encapsulant may comprise a Nd—F or Nd—F—O based material such as $NdF_3$ in silicone deposited directly on the LED chip or on the array of LED chips (e.g., chip-on-board array, COB array) as further detailed herein.

Figure 3:
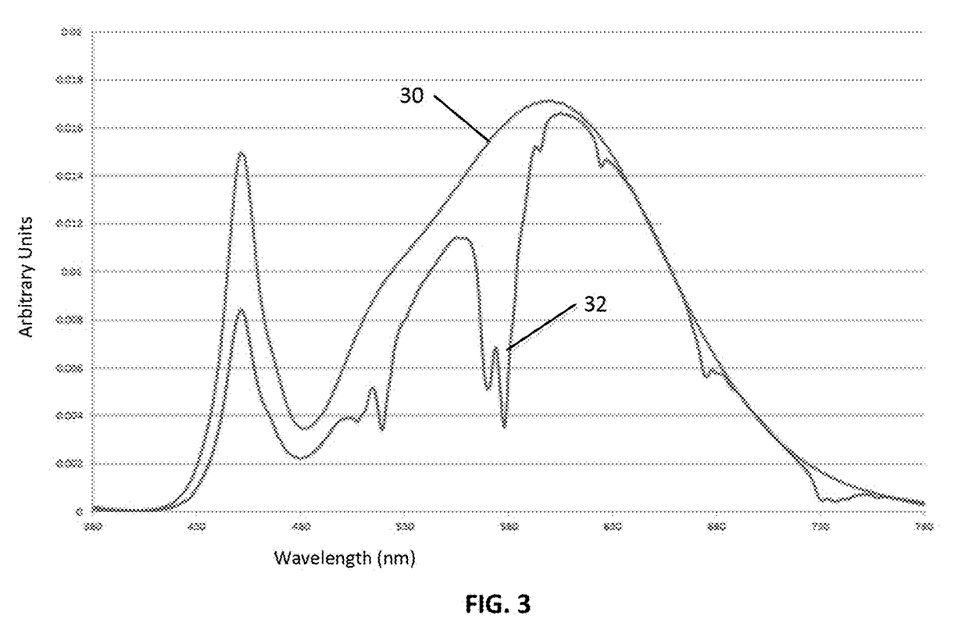
FIG. 3 is a graph comparing an emission spectrum of $NdF_3$ blended into silicone and directly deposited on a commercial LED package (NICHIA 757), and an emission spectrum of the base NICHIA757 LED.

FIG. 3 is a graph comparing an emission spectrum of $NdF_3$ blended into silicone and directly deposited on a commercial LED package (NICHIA 757), i.e., further encapsulating this LED package, as represented by a curve 32. As can be seen in FIG. 3, the spectrum is quite different, in that a significant depression is seen at a region or regions in the area between about 570 nm and about 590 nm, as compared to the emission spectrum of the base NICHIA757 LED, represented by a curve 30.

Figure 4:
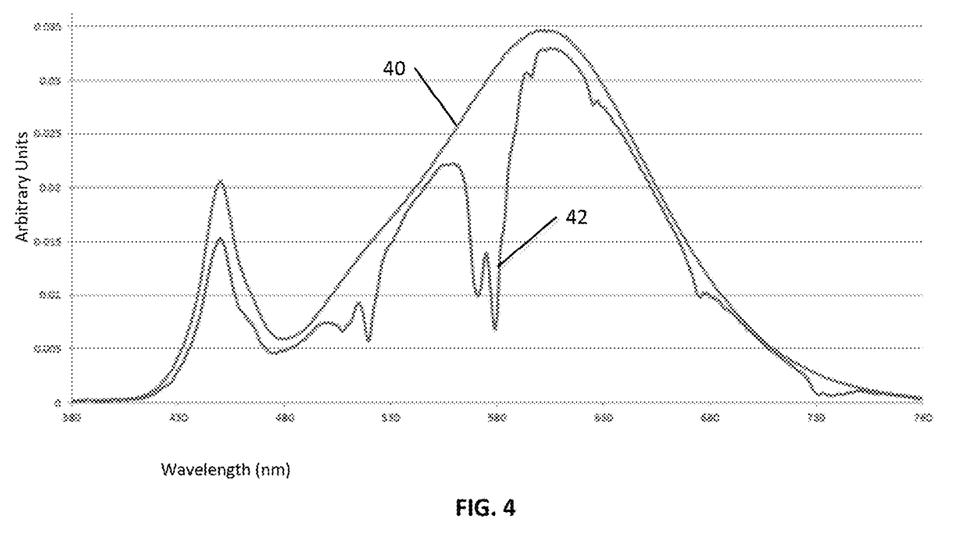
FIG. 4 is a graph comparing an emission spectrum of $NdF_3$ blended into silicone and directly deposited upon a COB array (TG66), and an emission spectrum of the base TG66 COB array.

FIG. 4 is a graph comparing an emission spectrum of $NdF_3$ blended into silicone and directly deposited on a COB array (TG66) represented by a curve 42, to that of the base TG66 COB array represented by a curve 40 as a function of wavelength. The spectrum presented by the curve 42 is similar to the curve 32 of FIG. 3.

The above examples evidence the utility of a Nd—F material (e.g., $NdF_3$) as a color-filtering absorptive material, applied as part of an encapsulating material to LED packages or arrays, to enhance at least one of the following lighting metrics: CSI, CRI, R9, or whiteness index (i.e., proximity to the white body locus), or the like. Table 1 below shows resultant performances for examples presented in FIGS. 3 and 4 compared with a conventional LED comprising Nd glass.

TABLE 1

Comparison of resultant performances presented in FIGS. 3 and 4 with a conventional LED with Nd:glass.

|  | L/W | CCX | CCY | CCT | CRI | R9 | GAI | Revealness |
|---|---|---|---|---|---|---|---|---|
| NdF$_3$ on NICHIA 757 | 236 | 0.4498 | 0.3954 | 2722 | 92 | 50 | 49 | 110 |
| NdF$_3$ on TG 66 | 249 | 0.4503 | 0.3934 | 2698 | 90 | 39 | 48 | 110 |
| White LED with Nd glass | 249 | 0.4486 | 0.3961 | 2700 | 88 | 62 | 50 | 111 |

As can be seen above from Table 1, the NICHIA 757 LED device generally has a Lumens/Watt value of 236. When NdF$_3$ is used as encapsulant in silicone, the CRI (color rendering/saturation index) is 92, the R9 (color rendering value of a red color chip) has a value of 60, the gamut area index (GAI) is 49, and the revealness based on LPI (as defined herein) of the emitted light is 110. When the TG 66 array of LED chips (COB array) is encapsulated in silicone comprising NdF$_3$, the CRI is seen to be 90, the R9 value is 39, the GAI is 50, and "Revealness" is also 110. These values compare favorably to the color filtering effects of Nd glass combined with white LEDs, as shown on the bottom row of the Table 1. Values of chromaticity coordinates (CCX and CCY) and CCT (color correlated temperature) are shown for reference for all three cases.

Figure 5:
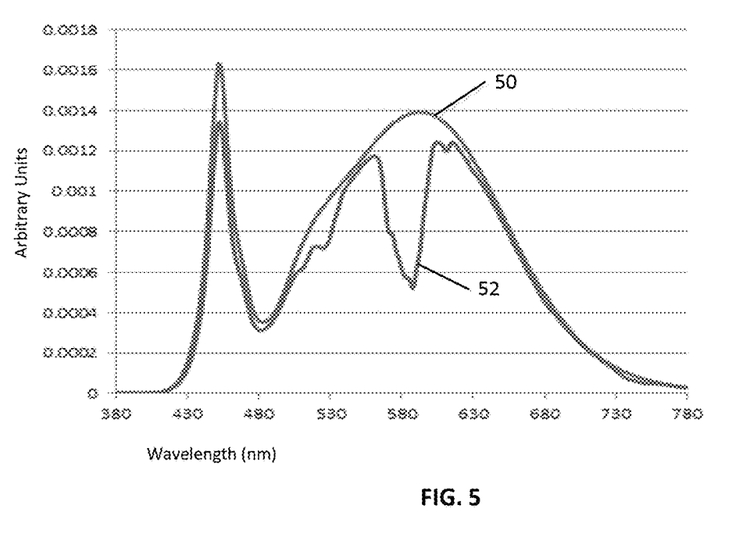
FIG. 5 is a graph comparing an emission spectrum of Nd—F—O blended into silicone and directly deposited on a commercial LED package (NICHIA 757 with 4000 K CCT), and an emission spectrum of the base NICHIA757 LED.

For example, FIG. 5 is a graph comparing an emission spectrum of Nd—F—O blended into silicone and directly deposited on a commercial LED package (NICHIA 757 with 4000 K CCT), thus further encapsulating this LED package, represented by a curve 52 as a function of wavelength. Similarly to the example of FIGS. 3 and 4, the spectrum 52 has a significant depression at a region or regions in the area between about 570 nm and about 590 nm, as compared to the emission spectrum of the base NICHIA757 LED represented by a curve 50.

Table 2 below shows resultant performances for the example presented in FIG. 5 for Nd—F—O in silicone directly deposited on a commercial LED package (NICHIA 757 with 4000K CCT) compared with a conventional LED with silicone encapsulant (NICHIA 757 with 4000K CCT) as well as with other types of silicone encapsulant doped with neodymia (Nd$_2$O$_3$) and with neodymium fluoride (NdF$_3$). Table 2 lists similar parameter as Table 1 with an addition of CSI (color saturation index) parameter for the above materials.

TABLE 2

The comparison of resultant performances for an LED with silicone encapsulant, doped with different Nd based materials, and without doping.

|  | Refractive index of encapsulant/dopant | Lumens output | CCX | CCY | CCT | CRI | R$_9$ | CSI | Revealness (LPI) |
|---|---|---|---|---|---|---|---|---|---|
| Original LED (Nichia 757) | 1.40 (RI for Si encapsulant per se) | 1427 | 0.457 | 0.4073 | 2715 | 81 | 15 | −14 | 91 |
| LED with NdFO doped silicone | 1.72 (for NdFO in Si encapsulant) | 1316 | 0.454 | 0.4096 | 2776 | 88 | 44 | −3 | 98 |
| LED with Nd$_2$O$_3$ doped silicone | 1.8 (for neodymia Nd$_2$O$_3$ in Si encapsulant) | 1162 | 0.4551 | 0.4153 | 2804 | 86 | 57 | −4 | 94 |
| LED with NdF$_3$ doped silicone | 1.6 (for NdF$_3$ in Si encapsulant) | 1420 | 0.4454 | 0.4053 | 2872 | 84 | 23 | −11 | 94 |

The Nd—F material does not have to be simply neodymium fluoride (NdF$_3$) as in the example of FIGS. 3 and 4. It may also be any one of Nd—X—F compounds with X representing other element or a combination of elements as described above, and being chemically attached with F. In this manner, such Nd—X—F material may enhance at least one of the following lighting metrics: CSI, CRI, R$_9$, whiteness index (i.e., proximity to the white body locus), or the like.

It is noted that Nd$_2$O$_3$ will have a higher scattering loss than either NdFO or NdF$_3$, due to its higher RI. However, NdFO has a better performance on the balance between CSI and LPI. Compared with Nd$_2$O$_3$, the Nd—F compound such as NdF$_3$, either alone or mixed with the NdFO material, will have a lower RI to minimize scattering loss. Furthermore, as compared with Nd$_2$O$_3$, the Nd—F compound such as NdF$_3$, either alone or mixed with an NdFO material, can enable a desirable yellow absorption peak for the spectrum of the LED light, to achieve a higher CSI with a reduced lumen penalty. Values of chromaticity coordinates (CCX and CCY), CCT and CRI are shown for reference, for all four cases.

In certain embodiments, one may choose an Nd—F material or an Nd—F—O material or an Nd—X—F material, so as to have a refractive index match with the encapsulating material to minimize scattering loss. One may also blend one Nd—F material (e.g., neodymium fluoride) with another Nd—X—F material (e.g., neodymium oxyfluoride). The element "X" in an Nd—X—F compound may be chosen so as to tune the absorption in a region around 580 nm, in order to better match the spectrum with the "R9 curve".

In some embodiments, the Nd—F material (which broadly embraces all Nd—X—F materials described herein), may be blended into an encapsulating material along with one or more luminescent materials, such as phosphors. For example, the Nd—F color-filtering material may be blended with a yellow-green phosphor and/or a red phosphor. For example, the Nd—F material may be blended with a Ce-doped YAG phosphor and/or a conventional red nitride phosphor, such as a $Eu^{2+}$-doped CaAlSiN red phosphor. In another example, the Nd—F—O material can be blended with YAG:Ce phosphor and a red nitride phosphor in silicone, encapsulating a blue-emitting NICHIA 757 LED. Without being limited by theory, emission from the YAG:Ce phosphor and the red nitride phosphor may be enhanced by the addition of the Nd—F—O, in accordance with Mie scattering theory.

FIGS. 6a-6d demonstrate different non-limiting examples of an LED-based lighting apparatus 60a, 60b, 60c and 60d respectfully, incorporating Nd—F compound (or more generally Nd—X—F compounds as described herein) along with the phosphor to achieve favorable visible absorption/generation characteristics, according to various embodiments of the invention. In FIGS. 6a-6d the LED-based lighting apparatus 60a, 60b, 60c or 60d includes a dome 62 that can be an optically transparent or translucent substrate enclosing an LED chip 65 mounted on a printed circuit board (PCB) 66. Leads provide current to the LED chip 65, thus causing it to emit radiation. The LED chip may be any semiconductor light source, especially a blue or ultraviolet light source that is capable of producing white light when its emitted radiation is directed onto the phosphor. In particular, the semiconductor light source may be a blue/ultraviolet emitting LED based on a nitride compound semiconductor generalized as $In_iGa_jAl_kN$ (where $0 \le i$; $0 \le j$; $0 \le k$ and $i+j+k=1$) having an emission wavelength greater than about 200 nm and less than about 550 nm. More particularly, the chip may be a near-UV or blue emitting LED having a peak emission wavelength from about 400 to about 500 nm. Even more particularly, the chip may be a blue emitting LED having a peak emission wavelength in a range about 440-460 nm. Such LED semiconductors are known in the art.

Figure 6A:
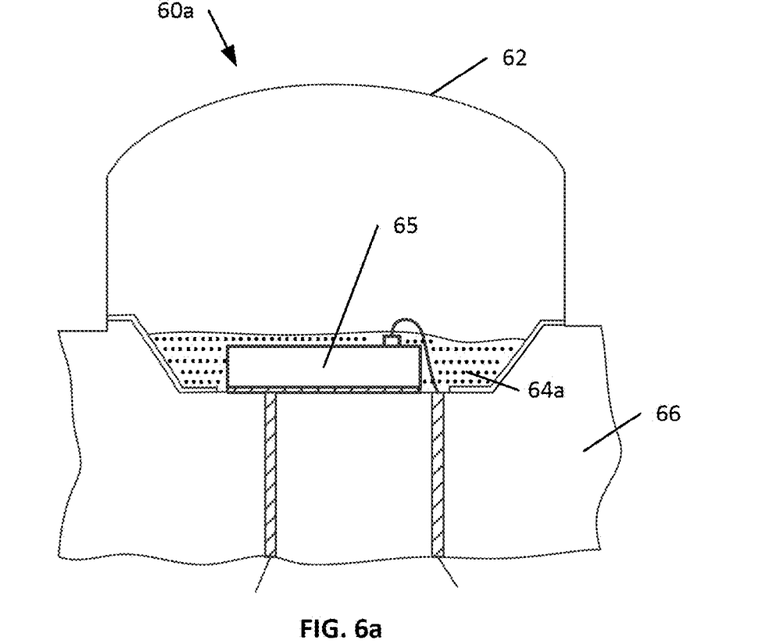
FIGS. 6a-6d are non-limiting examples of an LED-based lighting apparatus, incorporating a Nd—F compound (or more generally Nd—X—F compound as described herein) along with a phosphor to impart favorable visible absorption/generation characteristics according to various embodiments of the invention.

According to one embodiment shown in FIG. 6a, a polymer composite layer (encapsulant compound) 64a can comprise a Nd—F compound (and/or generally Nd—X—F compound) blended with a phosphor to impart favorable visible absorption/generation characteristics according to various embodiments described herein. This compound layer 64a can be disposed directly on a surface of the LED chip 65 and radiationally coupled to the chip. "Radiationally coupled" means that radiation from the LED chip is transmitted to the phosphor, and the phosphor emits radiation of a different wavelength. In a particular embodiment, the LED chip 65 may be a blue LED, and the polymer composite layer can include a blend of Nd—F and a yellow-green phosphor such as a cerium-doped yttrium aluminum garnet, Ce:YAG. The blue light emitted by the LED chip mixes with the yellow-green light emitted by the phosphors of polymer composite layer, and the net emission appears as white light which is filtered by the Nd—F. Thus LED chip 65 may be enclosed by the encapsulant material layer 64a. The encapsulant material may be a low-temperature glass, a thermoplastic or thermoset polymer or resin, or a silicone or epoxy resin. The LED chip 65 and the encapsulant material layer 64a may be encapsulated within a shell (restricted by the dome 62). Alternatively, the LED apparatus 60a may only include the encapsulant layer 64a without the outer shell/dome 62. In addition, scattering particles may be embedded in the encapsulant material. The scattering particles may be, for example, alumina ($Al_2O_3$), silica ($SiO_2$) or titania ($TiO_2$). The scattering particles can effectively scatter the directional light emitted from the LED chip, preferably with a negligible amount of absorption.

To form a polymer composite layer that includes Nd—F (Nd—X—F) on a surface of an LED chip, the particles may be dispersed in a polymer or polymer precursor, particularly a silicone or silicone epoxy resin, or precursors therefor. Such materials are well known for LED packaging. The dispersion mixture is coated on the chip by any suitable process, and particles having a larger density or particle size, or a larger density and larger particle size, preferentially settle in the region proximate the LED chip, forming a layer having a graded composition. Settling may occur during the coating or curing of the polymer or precursor, and may be facilitated by a centrifuging process, as known in the art. It is further noted that the parameters of dispersion of the phosphor and the Nd—F(Nd—X—F), e.g., including particle density and size and process parameters, can be chosen to provide the phosphor material being closer to the LED chip 65 than Nd—F(Nd—X—F) compounds, in order to provide an appropriate filtering by the Nd—F/Nd—X—F compound of the light generated by the phosphor component.

Figure 6B:
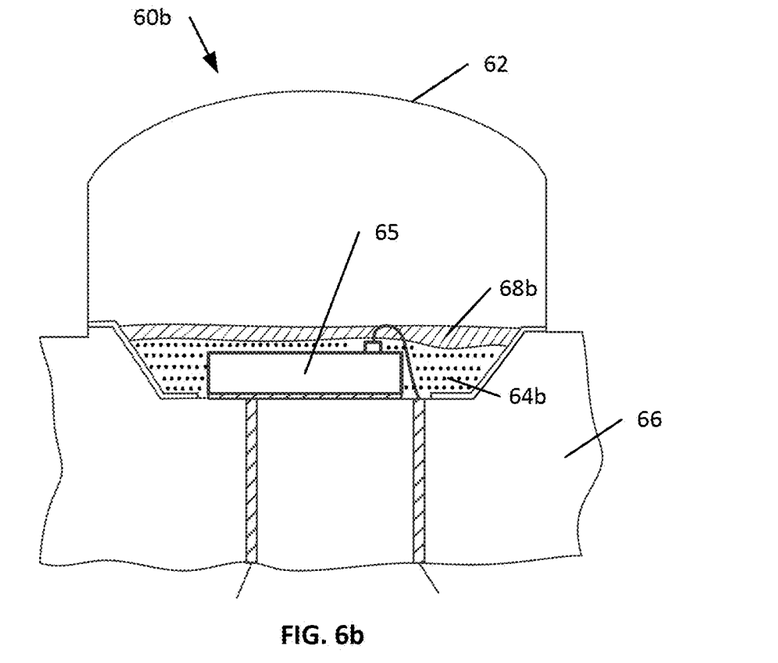

In an alternative exemplary embodiment shown in FIG. 6b, the phosphor layer 64b may be a conventionally fabricated encapsulant layer, and a separate encapsulant layer 68b with the Nd—F(Nd—X—F) compound may be deposited on top of the phosphor layer 64b, e.g., using the appropriate conventional deposition/particle dispersion technique in a polymer or polymer precursor.

Figure 6C:
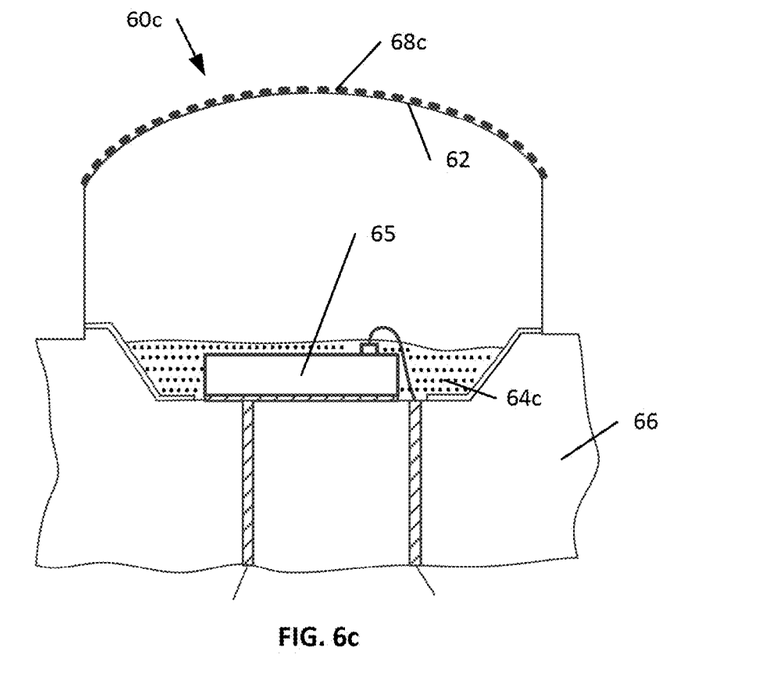

In a further exemplary embodiment shown in FIG. 6c, a Nd—F/Nd—X—F composite layer 68c can be coated on an outer surface of the dome (shell) 62. The performance of the coated layer 68b is similar to the performance of the encapsulant layer 68b with the Nd—F(Nd—X—F) compound in FIG. 6b. Alternatively, the coating 68c in FIG. 6c can be deposited on an inner surface of the dome 62. More implementation details regarding coating of the dome/substrate will be discussed in reference to FIGS. 7-10. It is noted that the dome 62 itself can be transparent or translucent.

Figure 6D:
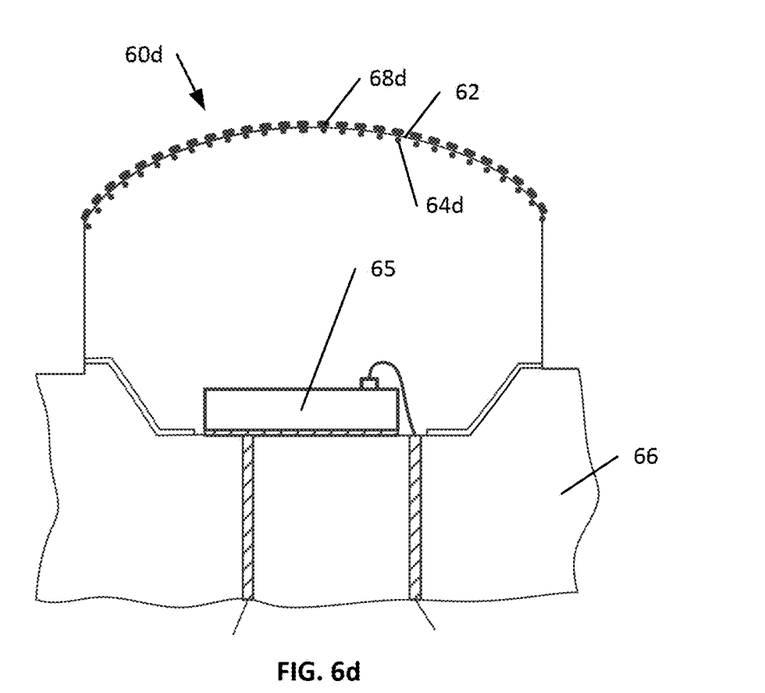

In yet a further exemplary embodiment, as shown in FIG. 6d, the dome (shell) 62 can be used to deposit both Nd—F/Nd—X—F composite layer/coating 68d on the outer surface of the dome 62 and a phosphor coating layer 64d on the inner surface of the dome 62. It is further noted that there may be different variations of this approach. For example, both coatings 64d and 68d may be deposited on one surface (outer or inner surface) of the dome 62 with the phosphor coating 64d being closer than the coating 68d to the LED chip 65. Also, coatings 64d and 68d (when deposited on one surface of the dome 62) can be combined in one layer similar to the encapsulant compound layer 64a in FIG. 6a. It is noted that the dome 62 itself can be transparent, translucent or transflective, in order to implement different variations of the example shown in FIG. 6d.

Below are several non-limiting examples of an LED-based lighting apparatus using the coating containing the Nd—F and/or Nd—X—F compound causing a desired color filter effect.

Figure 7:
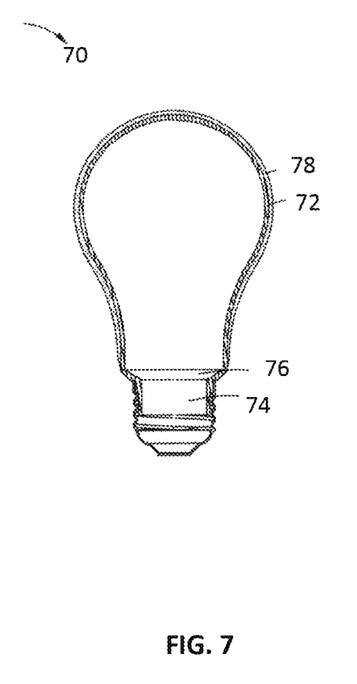
FIG. 7 is a cross-sectional view of an LED-based lighting apparatus in accordance with one embodiment of the invention.

FIG. 7 is an LED-based lighting apparatus suitable for area lighting applications in accordance with one embodiment of the invention. The LED-based lighting apparatus (which may also be referred to as a "lighting unit" or "lamp") is an LED lamp 70 which may be configured to provide a nearly omnidirectional lighting capability. As shown in FIG. 7, the LED lamp 70 includes a bulb 72, a connector 74, and a base 76 between the bulb 72 and the connector 74, and a coating 78 on an outer surface of the bulb 72. The coating 78 includes the Nd—F and/or Nd—X—F compound described herein. In other embodiments, the bulb 72 can be replaced by other transparent or translucent substrates. Alternatively, the coating 78 may be coated on an inner surface of the bulb 72 which can be transparent or translucent.

Figure 8:
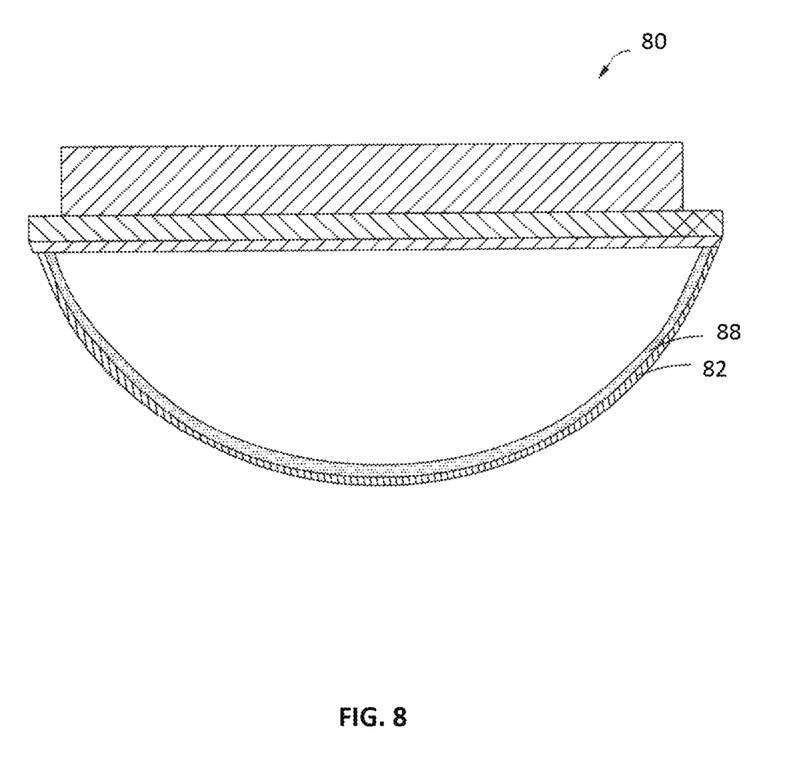
FIG. 8 is a cross-sectional view of an LED-based lighting apparatus in accordance with another embodiment of the invention.

FIG. 8 is an LED-based lighting apparatus 80 in accordance with a further embodiment of this invention. As shown in FIG. 8, the LED-based lighting apparatus is a ceiling lamp 80 (LED chip is not shown). The ceiling lamp 80 includes a hemispherical substrate 82 and a coating 88 containing the Nd—F and/or Nd—X—F compound; the coating 88 is on an inner surface of the hemispherical substrate 82. Alternatively, the coating 88 may be coated on an outer surface of the hemispherical substrate 82 which can be transparent or translucent.

Figure 9:
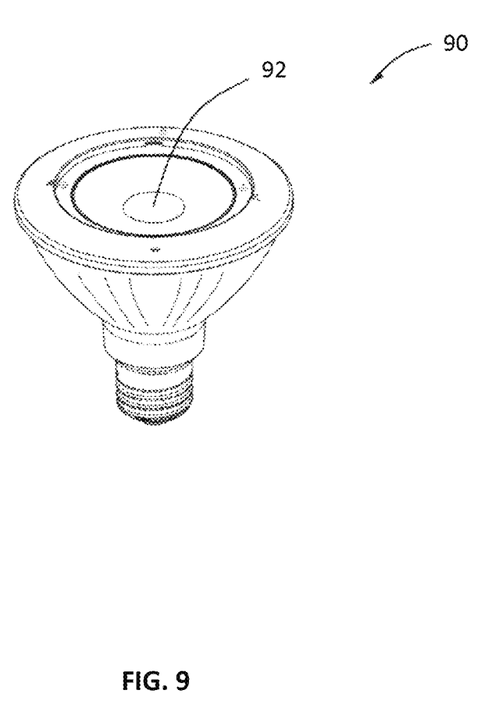
FIG. 9 is a perspective view of an LED-based lighting apparatus in accordance with a further embodiment of this invention.

FIG. 9 is an LED-based lighting apparatus in accordance with a further embodiment of this invention. As shown in FIG. 9, the LED-based lighting apparatus is a lens 90, and the lens 90 includes a substrate 92 (e.g., a flat substrate). In this embodiment, the substrate 92 includes Nd—F and/or Nd—X—F compound coating (not shown) on an inner and/or outer surface thereof.

Figure 10:
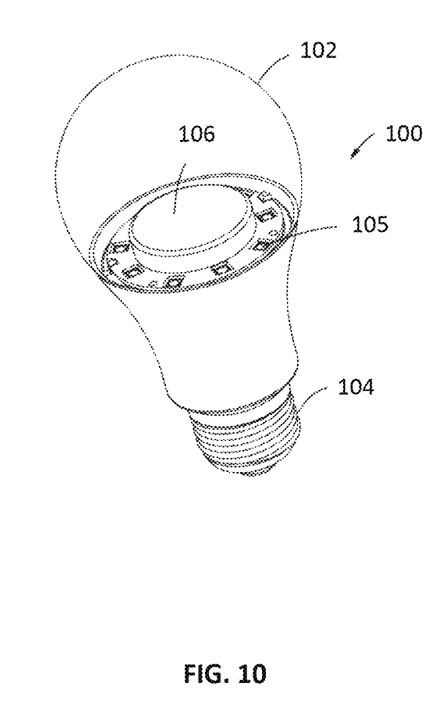
FIG. 10 is a perspective view of an LED-based lighting apparatus in accordance with one further embodiment of this invention.

FIG. 10 is an LED-based lighting apparatus 100 in accordance with one further embodiment of the invention. The LED-based lighting apparatus 100 includes a bulb (dome) 102, at least one LED chip 105 and a reflective substrate 106. The reflective substrate 106 is configured to reflect the visible light generated by the LED chip 105. In an embodiment described herein, the reflective substrate 106 includes Nd—F and/or Nd—X—F compound coating (not shown) on an outer surface thereof for providing the desired filtering. In FIG. 10 the dome (102) can be constructed of a diffusing material, so that a certain amount of light from the LEDs will pass through, and a certain amount will be reflected back into the cavity (these amounts depend on how highly diffusing the dome material is). The reflected light will either reflect specularly or diffusely, depending on the diffusivity of the dome 102. These diffuse and/or specular reflections from the dome 102 will be incident upon the reflective substrate 106 coated according to one of the embodiment described herein. Alternatively the dome 102 can be constructed from a semi-reflective material to provide the same functionality.

The coating materials described herein, including a compound containing Nd3+ ions and F— ions, may have little optical scattering (diffusion) effect; or, alternatively, may cause considerable optical scattering on light passing therethrough. To increase a scattering angle, the coating may include discrete particles of an organic or inorganic material. Alternatively, the organic or inorganic material can be solely made up of discrete particles of the Nd—F and/or Nd—X—F compound (e.g., formed partially or entirely of the Nd—F and/or Nd—X—F compound) and/or made up of a mixture of discrete particles of the Nd—F and/or Nd—X—F compound (e.g., formed partially or entirely of the Nd—F and/or Nd—X—F compound) and particles formed of at least one other different material.

In one embodiment, a suitable particle size for the organic or inorganic material can be from about 1 nm to about 10 microns. For the LED lamp 70 shown in FIG. 7, in order to maximize a scattering angle so that the LED lamp 70 could achieve omni-directional lighting, the particle size may be chosen to be much less than 300 nm to maximize efficiency of a Rayleigh scattering.

Although not intended to be limiting, the Nd—F and/or Nd—X—F compound coating may be applied by, for example, spray coating, roller coating, meniscus or dip coating, stamping, screening, dispensing, rolling, brushing, bonding, electrostatic coating or any other method that can provide a coating of even thickness. The following will describe three non-limiting examples of how to provide the Nd—F and/or Nd—X—F compound coating on the substrate.

In one embodiment, as shown in FIG. 7, the coating 37 may be coated on the bulb 72 by a bonding method. The LED lamp 70 can include a bonding layer (not shown) between the bulb 72 and the coating 78, and the bonding layer may include an organic adhesive or an inorganic adhesive. The organic adhesive can include an epoxy resin, an organic silicone adhesive, an acrylic resin, etc. The inorganic adhesive can include a silicate inorganic adhesive, a sulfate adhesive, a phosphate adhesive, an oxide adhesive, a boric acid salt adhesive etc.

In another embodiment, as shown in FIG. 7, the coating 78 may be coated on the outer surface of the bulb 72 by a spray-coating method. Firstly, a liquid mixture containing, for example, NdFO and/or $NdF_3$ compounds, silicone dioxide, dispersant such as Dispex A40, water and optionally $TiO_2$ or $Al_2O_3$ is formed. Subsequently, the formed liquid mixture is sprayed onto the bulb 72. Finally, the bulb 72 is cured to obtain the coated LED lamp 70.

In one embodiment, as shown in FIG. 7, the coating 78 may be coated onto the outer surface of the bulb 72 by an electrostatic coating method. Firstly, electrically charged powder consisting, for example, NdFO and/or $NdF_3$ compounds, $SiO_2$ and $Al_2O_3$ is produced. Subsequently, the powder is coated onto the bulb 72 which is oppositely charged.

In other embodiments of the invention, both the spray coating method and the electrostatic coating method may use materials without organic solvent or organic compound, which can extend the service life of the LED light apparatus and avoid the discoloration typically caused by sulfonation.

In a further embodiment, a weight percentage of $NdF_3$ or another $Nd^{3+}$ ion source (for examples, using Nd—F compounds and Nd—X—F compounds) in the coating may be between 1% to about 20%. In one specific embodiment, the weight percentage of $NdF_3$ or another $Nd^{3+}$ ion source in the coating may be in a range from about 1% to about 10%. In other embodiments, to promote refraction of the light to achieve a white reflective appearance, the coating further may include an additive having a higher refractive index relative to the Nd—F and/or Nd—X—F compound. The additive can be selected from metal oxides and non-metal oxides, such as $TiO_2$, $SiO_2$ and $Al_2O_3$.

Unless defined otherwise, technical and scientific terms used herein have the same meaning as is commonly understood by one having ordinary skill in the art to which this disclosure belongs. The terms "first", "second", and the like, as used herein, do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof, as well as additional items. The terms "connected" and "coupled" are not restricted to physical or mechanical connections or couplings, and can include electrical and optical connections or couplings, whether direct or indirect.

Furthermore, the skilled artisan will recognize the interchangeability of various features from different embodiments. The various features described, as well as other known equivalents for each feature, can be mixed and matched by one of ordinary skill in this art, to construct additional systems and techniques in accordance with principles of this disclosure.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described and claimed herein may be used separately, combined or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

The invention claimed is:

1. An apparatus comprising:
at least one light emitting diode (LED) module, configured to generate a white light; and
at least one encapsulating layer configured to filter the generated white light, the at least one encapsulating layer comprising a color-filtering compound comprising a Nd—X—F compound, wherein X is one or more of O, N, S, Cl, OH, Na, K, Al, Mg, Li, Ca, Sr, Ba or Y, blended or dispersed in silicone, and
a phosphor dispersed or blended in the at least one encapsulating layer or encapsulated in a further encapsulating layer in addition to the at least one encapsulating layer; and
wherein the color-filtering compound is configured to have a refractive index that is similar to that of silicone and is configured to absorb a yellow light in the wavelength range between about 530 nm and 600 nm from the generated white light.

2. The apparatus of claim 1, wherein the color-filtering compound comprises $Nd^{3+}$ ions and $F^-$ ions.

3. The apparatus of claim 1, wherein the at least one encapsulating layer is deposited on top of the at least one LED module to filter its generated white light.

4. The apparatus of claim 1, wherein the phosphor is encapsulated in the further encapsulating layer in addition to the at least one encapsulating layer and the further encapsulating layer containing phosphor is deposited directly on top of the at the least one LED module and the at least one encapsulating layer containing Nd—X—F is deposited on top of the further encapsulating layer.

5. The apparatus of claim 1, wherein the color-filtering compound is NdFO.

6. The apparatus of claim 1, wherein the at least one encapsulating layer further comprises scattering particles of an organic or inorganic material, a particle size of the organic or inorganic material being in a range from about 1 nm to about 10 microns.

7. The apparatus of claim 1, further comprising a circuit connecting a plurality of LED modules, each configured to generate a white light and having an encapsulating layer configured to filter the generated white light.

8. The apparatus of claim 1, wherein X is O or OH, and the color-filtering compound is a neodymium oxyfluoride or a neodymium hydroxide fluoride.

9. An apparatus comprising:
at least one light emitting diode (LED) module, configured to generate a visible light; and
at least one optical component comprising a transparent, translucent or reflective substrate; and
a coating on a surface of the substrate, wherein the coating comprises a color-filtering compound blended or dispersed in silicone and configured to absorb the generated visible light in a yellow light wavelength range between about 530 nm and 600 nm,
said color-filtering compound comprising a Nd—X—F compound, wherein X is one or more of O, N, S, Cl, OH, Na, K, Al, Mg, Li, Ca, Sr, Ba or Y,
wherein the Nd—X—F compound is configured to have a refractive index that is similar to that of silicone.

10. The apparatus of claim 9, wherein a weight percentage of the color-filtering compound in the coating is from about 1% to about 20%.

11. The apparatus of claim 9, wherein a thickness of the coating is in a range from about 50 nm to about 1000 microns.

12. The apparatus of claim 9, wherein the coating further comprises an additive having a higher refractive index than the color-filtering compound, and wherein the additive is selected from metal oxides and non-metal oxides.

13. The apparatus of claim 12, wherein the additive is selected from the group consisting of $TiO_2$, $SiO_2$ and $Al_2O_3$.

14. The apparatus of claim 9, wherein the coating is coated on an inner surface of the reflective substrate or the diffuser.

15. The apparatus of claim 9, wherein the substrate is a diffuser selected from the group consisting of a dome enclosing the at least one LED module, a bulb, and a lens.

16. The apparatus of claim 9, wherein the optical component further comprises a bonding layer between the reflective substrate or the diffuser and the coating, the bonding layer comprises an organic adhesive or an inorganic adhesive.

17. The apparatus of claim 9, wherein the coating is coated on the surface of the substrate by one of a spray coating method and an electrostatic coating method.

18. An apparatus comprising:
at least one light emitting diode (LED) module, configured to generate a white light; and
at least one optical component comprising a Nd—X—F color-filtering compound dispersed or blended in silicone,
wherein the Nd—X—F color-filtering compound is configured to have has a refractive index that is similar to that of silicone to filter the generated white light in a yellow light wavelength range between about 530 nm and 600 nm, wherein X is one or more of O, N, S, Cl, OH, Na, K, Al, Mg, Li, Ca, Sr, Ba or Y.

19. The apparatus of claim 18, wherein X is one or more of N, S, Cl, OH, Na, K, Al, Mg, Li, Ca, Sr, Ba or Y.

20. The apparatus of claim 19, wherein the Nd—X—F color-filtering compound is neodymium hydroxide fluoride.

* * * * *